US012660655B2

(12) United States Patent
Koo et al.

(10) Patent No.: US 12,660,655 B2
(45) Date of Patent: Jun. 16, 2026

(54) SEMICONDUCTOR DEVICES AND METHODS FOR MANUFACTURING THEREOF

(71) Applicant: Infineon Technologies AG, Neubiberg (DE)

(72) Inventors: Kok Kiat Koo, Singapore (SG); So Seetharam Gobalakrisnan, Singapore (SG); Jürgen Schredl, Mering (DE); Julian Treu, Munich (DE); Dexter Inciong Reynoso, Singapore (SG)

(73) Assignee: Infineon Technologies AG, Neubiberg (DE)

( * ) Notice: Subject to any disclaimer, the term of this patent is extended or adjusted under 35 U.S.C. 154(b) by 372 days.

(21) Appl. No.: 18/225,931

(22) Filed: Jul. 25, 2023

(65) Prior Publication Data

US 2024/0030148 A1     Jan. 25, 2024

(30) Foreign Application Priority Data

Jul. 25, 2022     (DE) ..................... 10 2022 118 576.1

(51) Int. Cl.
| | |
|---|---|
| *H10W 70/65* | (2026.01) |
| *H10W 70/04* | (2026.01) |
| *H10W 70/40* | (2026.01) |
| *H10W 70/60* | (2026.01) |
| *H10W 72/00* | (2026.01) |
| *H10W 90/00* | (2026.01) |

(52) U.S. Cl.
CPC ......... *H10W 70/65* (2026.01); *H10W 70/047* (2026.01); *H10W 70/421* (2026.01); *H10W 70/611* (2026.01); *H10W 90/00* (2026.01);

*H10W 72/073* (2026.01); *H10W 72/884* (2026.01); *H10W 90/734* (2026.01); *H10W 90/753* (2026.01); *H10W 90/756* (2026.01)

(58) Field of Classification Search
CPC ........... H01L 23/5386; H01L 23/49541; H01L 21/4839; H01L 24/32; H01L 24/48; H01L 24/73; H01L 24/83; H01L 25/0655; H01L 2224/32225; H01L 2224/48137; H01L 2224/48245; H01L 2224/73265; H01L 2224/83
USPC .................................................. 257/666, 668
See application file for complete search history.

(56) References Cited

U.S. PATENT DOCUMENTS

| | | | | |
|---|---|---|---|---|
| 5,256,903 | A | * | 10/1993 | Obata ............... H01L 23/49506 257/676 |
| 5,373,188 | A | | 12/1994 | Michii et al. |

(Continued)

FOREIGN PATENT DOCUMENTS

| | | |
|---|---|---|
| DE | 43 01 915 | 5/1994 |
| DE | 10 2022 108 736 | 10/2022 |

(Continued)

*Primary Examiner* — Jasmine J Clark
(74) *Attorney, Agent, or Firm* — Dicke, Billig & Czaja, PLLC

(57) ABSTRACT

A semiconductor device and method is disclosed. In one example, the semiconductor device includes a single first row of leads and a first chip carrier comprising a first electrically insulating layer arranged on the single first row of leads. At least one first semiconductor chip is mounted on the first electrically insulating layer, wherein the at least one first semiconductor chip is arranged over only the single first row of leads.

14 Claims, 3 Drawing Sheets

(56)         References Cited

U.S. PATENT DOCUMENTS

| 5,767,571 | A | 6/1998 | Kimura et al. |
| 5,923,081 | A | 7/1999 | Tandy |
| 7,728,411 | B2 | 6/2010 | Lee et al. |
| 11,699,647 | B2 * | 7/2023 | Upendra ........... H01L 23/49866 |
| | | | 257/666 |
| 2002/0047189 | A1 | 4/2002 | Miyaki et al. |
| 2019/0067171 | A1 | 2/2019 | Estacio et al. |

FOREIGN PATENT DOCUMENTS

| JP | S6084854 | 5/1985 |
| JP | S63222454 | 9/1988 |

* cited by examiner

| Providing a single first row of leads | ~14 |

| Arranging a first chip carrier comprising a first electrically insulating layer on the first row of leads | ~16 |

| Mounting at least one first semiconductor chip on the first electrically insulating layer, wherein the at least one first semiconductor chip is arranged over only the single first row of leads | ~18 |

SEMICONDUCTOR DEVICES AND METHODS FOR MANUFACTURING THEREOF

CROSS-REFERENCE TO RELATED APPLICATION

This Utility patent application claims priority to German Patent Application No. 10 2022 118 576.1 filed Jul. 25, 2022, which is incorporated herein by reference.

TECHNICAL FIELD

The present disclosure relates to semiconductor devices including a semiconductor chip arranged over only a single row of leads. In addition, the present disclosure relates to methods for manufacturing such semiconductor devices.

BACKGROUND

In conventional semiconductor devices semiconductor chips may be arranged on diepads. Such usage of diepads may result in various drawbacks, such as e.g. design constraints, input/output parasitic effects, diepad vibration risks, etc. Manufacturers of semiconductor devices are constantly striving to improve their products. In particular, it may be desirable to provide semiconductor devices overcoming the above mentioned drawbacks. In this context, it may further be desirable to provide suitable methods for manufacturing such semiconductor devices.

SUMMARY

An aspect of the present disclosure relates to a semiconductor device. The semiconductor device comprises a single first row of leads. The semiconductor device further comprises a first chip carrier comprising a first electrically insulating layer arranged on the single first row of leads. The semiconductor device further comprises at least one first semiconductor chip mounted on the first electrically insulating layer, wherein the at least one first semiconductor chip is arranged over only the single first row of leads.

An aspect of the present disclosure relates to a method for manufacturing a semiconductor device. The method comprises providing a single first row of leads. The method further comprises arranging a first chip carrier comprising a first electrically insulating layer on the single first row of leads. The method further comprises mounting at least one first semiconductor chip on the first electrically insulating layer, wherein the at least one first semiconductor chip is arranged over only the single first row of leads.

BRIEF DESCRIPTION OF THE DRAWINGS

The accompanying drawings are included to provide a further understanding of aspects. The drawings illustrate aspects and together with the description serve to explain principles of aspects. Other aspects and many of the intended advantages of aspects will be readily appreciated as they become better understood by reference to the following detailed description. The elements of the drawings are not necessarily to scale relative to each other. Like reference signs may designate corresponding similar parts.

DETAILED DESCRIPTION

In the following detailed description, reference is made to the accompanying drawings, in which are shown by way of illustration specific aspects in which the disclosure may be practiced. In this regard, directional terminology, such as "top", "bottom", "front", "back", etc. may be used with reference to the orientation of the figures being described. Since components of described devices may be positioned in a number of different orientations, the directional terminology may be used for purposes of illustration and is in no way limiting. Other aspects may be utilized and structural or logical changes may be made without departing from the concept of the present disclosure. Hence, the following detailed description is not to be taken in a limiting sense, and the concept of the present disclosure is defined by the appended claims.

Figure 1A:
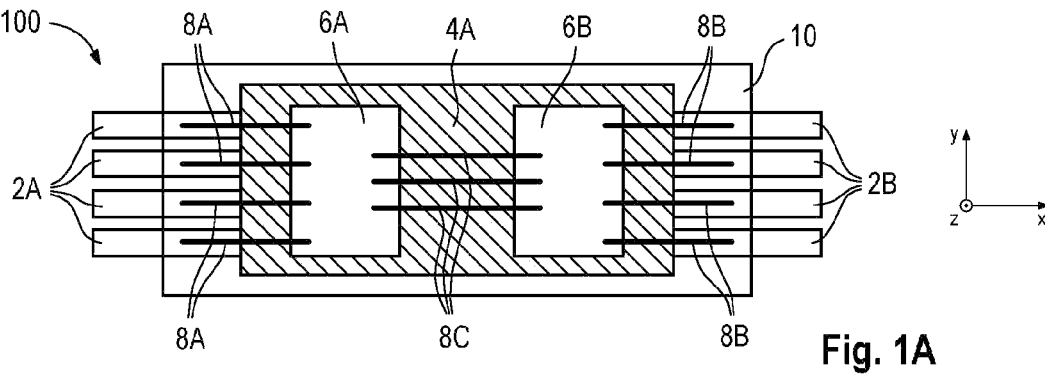
FIG. 1 includes FIGS. 1A and 1B schematically illustrating a cross-sectional top view and a cross-sectional side view of a semiconductor device 100 in accordance with the disclosure.
Figure 1B:
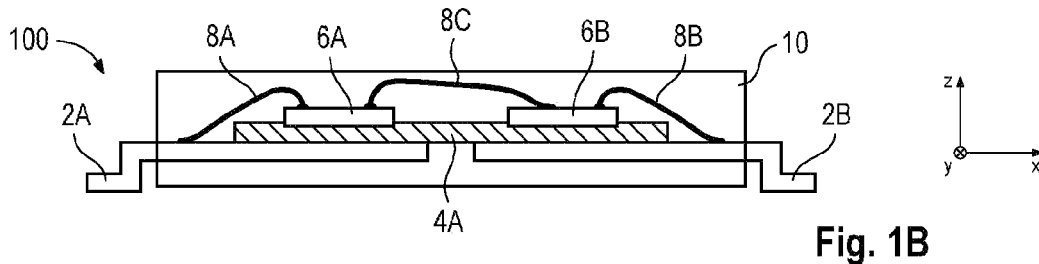

The semiconductor device 100 of FIG. 1 may include a single first row of leads (or lead fingers or pins) 2A, a first chip carrier comprising a first electrically insulating layer 4A arranged on the single first row of leads 2A, and at least one first semiconductor chip 6A mounted on the first electrically insulating layer 4A. The at least one first semiconductor chip 6A may be arranged over only the single first row of leads 2A. Optionally, the semiconductor device 100 may further include a second row of leads 2B, at least one second semiconductor chip 6B, multiple electrical connection elements 8A to 8C, and an encapsulation material 10. The at least one second semiconductor chip 6B may be mounted on the first electrically insulating layer 4A and may be arranged over the second row of leads 2B.

The first semiconductor chip 6A may be arranged exclusively over the first row of leads 2A, but not over the second row of leads 2B. That is, the first semiconductor chip 6A may be arranged over only one individual row of leads 2A. More particular, when viewed in the z-direction, the semiconductor chip 6A may not overlap with any other leads of the semiconductor device 100 except with the first row of leads 2A. The second row of leads 2B may be seen as an optional component of the semiconductor device 100. That is, in further examples, the semiconductor device 100 may only include the first row of leads 2A. In the example of FIG. 1, the second row of leads 2B may be arranged opposite to the first row of leads 2A.

For example, one or multiple of the leads 2A and 2B may be part of a leadframe. The leads 2A and 2B may be fabricated from metals and/or metal alloys, in particular at least one of copper, copper alloys, nickel, iron nickel, etc. The number of leads included in the first row of leads 2A may depend on the specific type of the semiconductor device 100. In the non-limiting example of FIG. 1, the first row of leads 2A may include an exemplary number of four leads. The first row of leads 2A may be formed by multiple leads arranged in parallel in a side-by-side manner. Here, the leads 2A may have a substantially similar length. First portions of the leads 2A embedded in the encapsulation material 10 may extend in a substantially linear direction, while second portions of the leads 2A protruding out of the encapsulation material 10 may be bent in an exemplary gull-wing shape. The second row of leads 2B may be at least partly similar to the first row of leads 2A such that above comments may also hold true for the second row of leads 2B.

The first chip carrier may include or may correspond to the first electrically insulating layer 4A. In one example, the chip carrier may be exclusively formed by the first electrically insulating layer 4A. In further examples, the first chip carrier may include at least one additional component, such as e.g. one or multiple additional layers. The first carrier (or the first electrically insulating layer 4A) may be configured to provide sufficient mechanical support or a sufficiently stable platform for mounting one or multiple semiconductor chips thereon. The first electrically insulating layer 4A may include or may be made of at least one of an adhesive film, an adhesive tape, a Kapton® tape, or a die attach film. In the example of FIG. 1, the first electrically insulating layer 4A may be arranged over both of the first row of leads 2A and the second row of leads 2B. In the illustrated example, the first electrically insulating layer 4A may be of a substantially rectangular shape when viewed in the z-direction. In further examples, the shape of the first electrically insulating layer 4A may be different such as e.g. square-shaped, elliptical, round, polygonal, etc.

In the example of FIG. 1, both semiconductor chips 6A and 6B may be mounted on top of the first electrically insulating layer 4A. That is, the first electrically insulating layer 4A may be configured as a chip carrier for both semiconductor chips 6A and 6B. In the illustrated case, the semiconductor chips 6A and 6B may be fully arranged over the first electrically insulating layer 4A when viewed in the z-direction. In other words, the footprints of the semiconductor chips 6A and 6B may be fully arranged inside the footprint of the first electrically insulating layer 4A.

The semiconductor chips 6A and 8B may be manufactured from an elemental semiconductor material (e.g. Si) or from a wide band gap semiconductor material or a compound semiconductor material (e.g. SiC, GaN, SiGe, GaAs). Note that throughout this description, the terms "chip", "semiconductor chip", "die", "semiconductor die" may be interchangeably used. The semiconductor chips 6A and 6B may be of arbitrary types and may include integrated circuits containing active electronic components and/or passive electronic components. The integrated circuits may be designed as logic integrated circuits, analog integrated circuits, mixed signal integrated circuits, power integrated circuits, memory circuits, integrated passives, etc.

One or multiple of the semiconductor chips 6A and 6B may correspond to power semiconductor chips. The term "power semiconductor chip" may refer to a semiconductor chip providing at least one of high voltage blocking or high current-carrying capabilities. A power semiconductor chip may be configured for high currents having a maximum current value of a few Amperes, such as e.g. 10 A, or a maximum current value of up to or exceeding 100 A. Similarly, voltages associated with such current values may have values of a few Volts to a few tens or hundreds of Volts.

The first semiconductor chip 6A may be electrically coupled to the first row of leads 2A via the first electrical connection elements 8A. In a similar fashion, the second semiconductor chip 6B may be electrically coupled to the second row of leads 2B via the second electrical connection elements 8B. Furthermore, the semiconductor chips 6A and 6B may be electrically coupled with each other via the third electrical connection elements 8C. In the example of FIG. 1, the electrical connection elements 8A to 8C may include or may correspond to bond wires. In further examples, at least one of the electrical connection elements 8A to 8C may include or may correspond to at least one of a ribbon, a clip, etc.

In one example, the first row of leads 2A and the at least one first semiconductor chip 6A may be configured to operate in a low voltage domain, while the second row of leads 2B and the at least one second semiconductor chip 6B may be configured to operate in a high voltage domain. In this context, the at least one first semiconductor chip 6A may correspond to a logic semiconductor chip, while the at least one second semiconductor chip 6B may correspond to a power semiconductor chip. The semiconductor chips 6A and 6B may form any appropriate circuitry according to the specific application type of the semiconductor device 100. In one example, the semiconductor chips 6A and 6B may be configured to operate as a gate driver, such as e.g. an isolated gate driver. In a further example, the semiconductor chips 6A and 6B may be configured to operate as a digital isolator. At least one lead of the first row of leads 2A may be configured as an input of the semiconductor device 100, while at least one lead of the second row of leads 2B may be configured as an output of the semiconductor device 100.

The encapsulation material 10 may encapsulate one or multiple components of the semiconductor device 100. That is, the encapsulation material 10 may form a case or housing for the encapsulated components such that the semiconductor device 100 may also be referred to as semiconductor package. End portions of the leads 2A and 2B may at least partly protrude out of the encapsulation material 10 such that the semiconductor chips 6A and 6B may be electrically accessible from outside of the housing formed by the encapsulation material 10. In the example of FIG. 1, the first row of leads 2A may protrude out of a first side surface of the encapsulation material 10, while the second row of leads 2B may protrude out of a second side surface of the encapsulation material 10 opposite to the first side surface. The encapsulation material 10 may include at least one of an epoxy, a filled epoxy, a glass fiber filled epoxy, an imide, a thermoplast, a thermoset polymer, a polymer blend, a laminate, etc. Various techniques may be used for encapsulating the components of the arrangement with the encapsulation material 10, for example at least one of compression molding, injection molding, powder molding, liquid molding, map molding, laminating, etc.

The semiconductor device 100 of FIG. 1 and other semiconductor devices in accordance with the disclosure may outperform conventional semiconductor devices in various ways. This quality may particularly result from the fact that the semiconductor device 100 may be free of diepads (or die paddles) as can be seen from FIG. 1. In this context, the semiconductor device 100 may also be referred to as diepad free device, diepad free leaded device, diepad free package or diepad free leaded package. In accordance with the disclosure a diepad as used in a conventional semiconductor device may be replaced by a chip carrier formed by an electrically insulating layer arranged over a row of leads.

Using diepads in conventional multi-chip devices may impose specific design constraints with regard to location and placement of the included semiconductor chips. In addition, specific clearance requirements between different voltage domains may need to be fulfilled, in particular between low voltage and high voltage domains. In contrast to this, semiconductor devices in accordance with the disclosure may not necessarily include diepads such that above mentioned restraints may be avoided.

Using diepads in conventional semiconductor devices may result in input to output parasitic effects, in particular for the case of high voltage galvanic isolated semiconductor packages. In contrast to this, such parasitic effects may be avoided in semiconductor devices without diepads in accordance with the disclosure.

In conventional semiconductor devices diepads may be connected to one or multiple leads. In some cases, these leads may thus not be available for input/output usage. Contrarily, in the example of FIG. 1 any of the leads 2A and 2B may be used as input lead and output lead, respectively. That is, in semiconductor devices in accordance with the disclosure leads may be freed up for input/output usage.

In conventional semiconductor devices a risk of vibrating diepads may occur, in particular during assembly and/or transportation processes. When a diepad is attached to a single tie bar or a single lead, during a bonding process and/or a molding process, vibration of the diepad may occur which may reduce the quality of the bonding and/or the bonded wires/connections, due to that the diepad is not sufficiently supported by two or more tie bars/leads. Vibrating diepads may result in stress and possible damage of bond wires electrically connecting semiconductor chips arranged on the vibrating diepads. When the semiconductor chips 6A and/or 6B are supported by multiple leads, the vibration effect during a bonding process and/or a molding process may be greatly reduced. Due to a lack of diepads the described risk of damaged bond wires may be avoided or at least reduced for semiconductor devices in accordance with the disclosure.

Figure 2A:
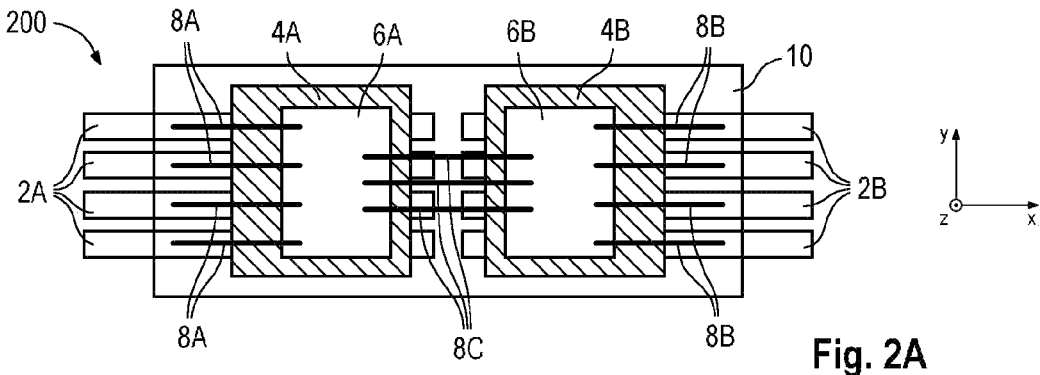
FIG. 2 includes FIGS. 2A and 2B schematically illustrating a cross-sectional top view and a cross-sectional side view of a semiconductor device 200 in accordance with the disclosure.
Figure 2B:
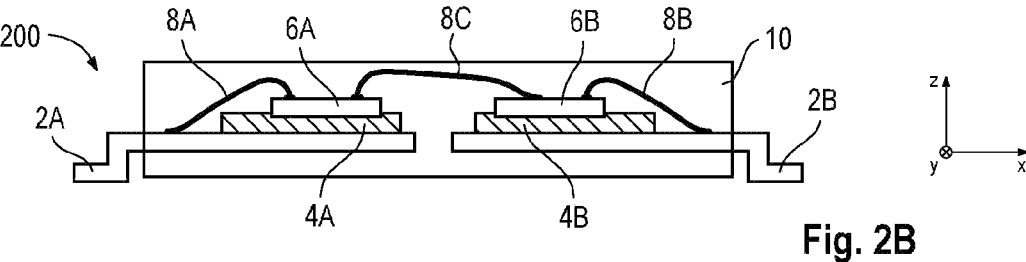

The semiconductor device 200 of FIG. 2 may include some or all features of the semiconductor device 100 of FIG. 1. In contrast to FIG. 1, the semiconductor device 200 may include a second chip carrier including a second electrically insulating layer 4B arranged on the second row of leads 2B. The second semiconductor chip 6B may be mounted on the second electrically insulating layer 4B. The two chip carriers formed by the electrically insulating layers 4A and 4B, respectively, may be made from any of the materials previously mentioned in connection with the first carrier or the first electrically insulating layer 4A of FIG. 1.

When viewed in the z-direction, each of the electrically insulating layers 4A and 4B may have a substantially rectangular shape. In further examples, the shapes of the electrically insulating layers 4A and 4B may be different such as e.g. square-shaped, elliptical, round, polygonal, etc. In the non-limiting example of FIG. 2, the electrically insulating layers 4A and 4B may be substantially identical with regard to shape and size. In further examples, the electrically insulating layers 4A and 4B may differ in at least one of shape or size.

In the example of FIG. 2, the footprint of the first semiconductor chip 6A may be fully arranged inside the footprint of the first electrically insulating layer 4A when viewed in the z-direction. Such case may e.g. occur when the first electrically insulating layer 4A is mounted on the first row of leads 2A first and afterwards the semiconductor chip 6A is arranged on the first electrically insulating layer 4A. In another example, the footprint of the first semiconductor chip 6A may be similar or substantially identical to the footprint of the first electrically insulating layer 4A. Such case may e.g. occur when the first semiconductor chip 6A is manufactured from a semiconductor wafer which is first covered by the first electrically insulating layer 4A on its backside and diced afterwards in order to obtain multiple semiconductor chips with backside isolation. The first semiconductor chip 6A including the backside isolation may then be attached to the first row of leads 2A. It is noted that above comments may also hold true for the second semiconductor chip 6B and the second electrically insulating layer 4B.

Figure 3A:
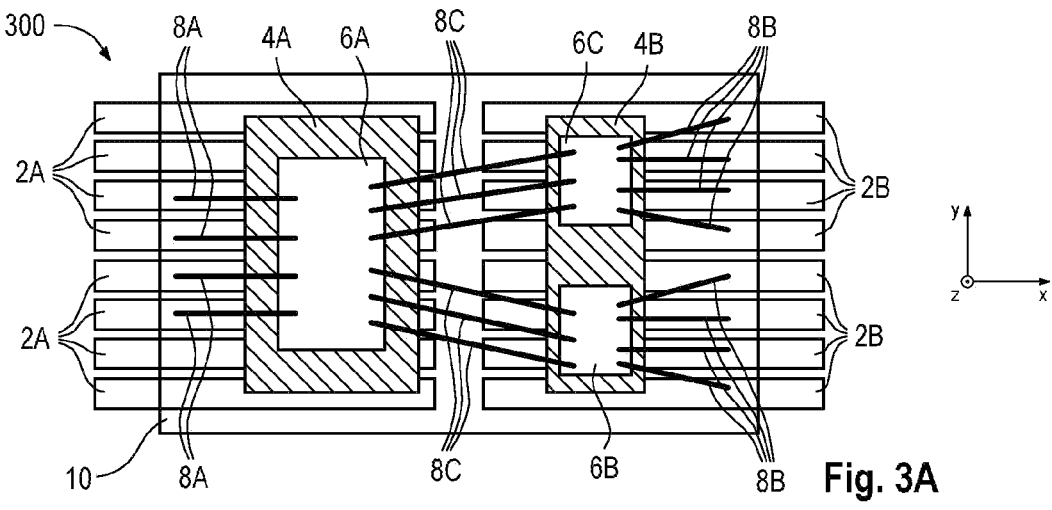
FIG. 3 includes FIGS. 3A and 3B schematically illustrating a cross-sectional top view and a cross-sectional side view of a semiconductor device 300 in accordance with the disclosure.
Figure 3B:
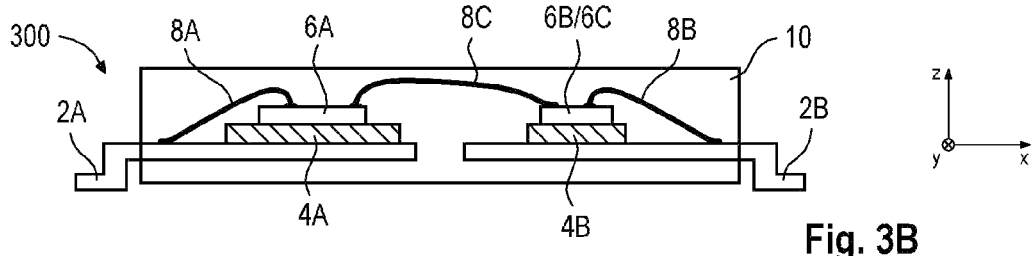

The semiconductor device 300 of FIG. 3 may include some or all features of previously described semiconductor devices in accordance with the disclosure. The semiconductor device 300 may exemplarily include three semiconductor chips 6A to 6C. The first semiconductor chip 6A may be arranged over the first electrically insulating layer 4A, while the second and third semiconductor chips 6B and 6C may be arranged on top of the second electrically insulating layer 4B. In the example of FIG. 3, the entire first electrically insulating layer 4A may be arranged over the first row of leads 2A. In a similar fashion, the footprint of the second electrically insulating layer 4B may be fully arranged inside the footprint of the second row of leads 2B. Furthermore, the first semiconductor chip 6A may be fully arranged over the first row of leads 2A, and each of the second and third semiconductor chips 6B and 6C may be fully arranged over the second row of leads 2B.

For example, the first semiconductor chip 6A may be a logic semiconductor chip, while each of the second and third semiconductor chips 6B and 6C may correspond to a power transistor chip. The electrically connected power transistor chips 6B and 6C may form a half bridge circuit, wherein one of the power transistor chips 6B and 6C may form a low side switch of the half bridge circuit, while the other power transistor chip may form a high side switch of the half bridge circuit. The logic semiconductor chip 6A may be configured to drive and/or control at least one of the power transistor chips 6B and 6C, in particular via a gate terminal of the respective power transistor chip. The logic semiconductor chip 6A may thus be referred to as driver semiconductor chip (or driver) or control semiconductor chip (or controller).

Figure 4A:
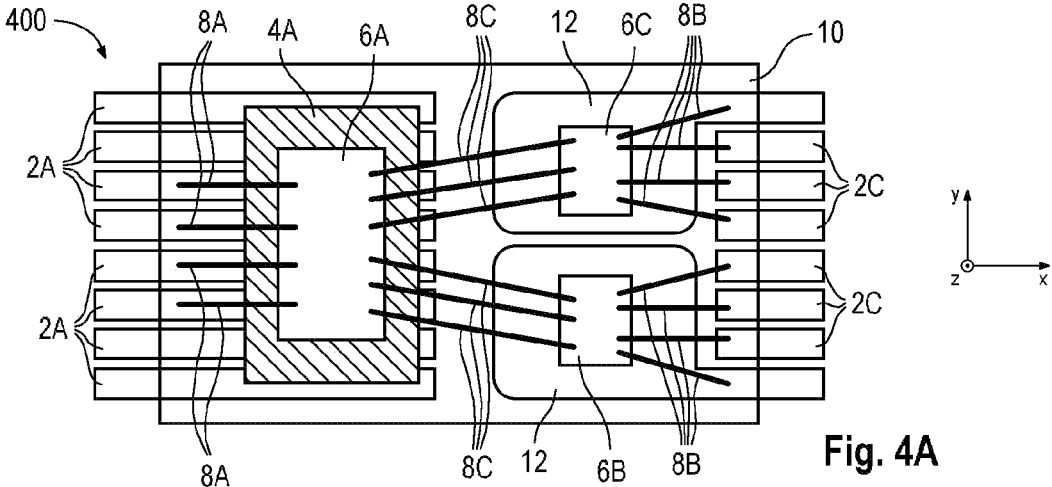
FIG. 4 includes FIGS. 4A and 4B schematically illustrating a cross-sectional top view and a cross-sectional side view of a semiconductor device 400 in accordance with the disclosure.
Figure 4B:
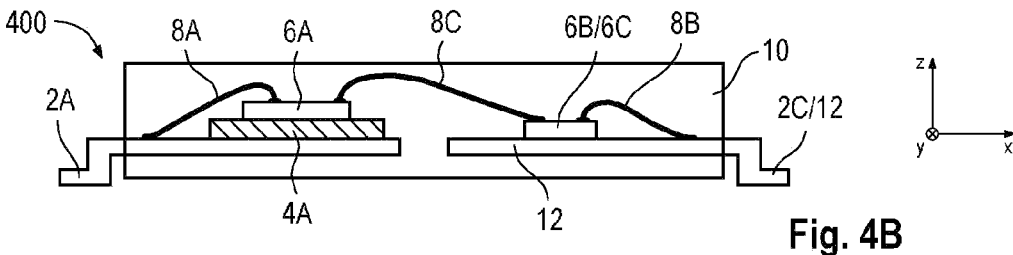

The semiconductor device 400 of FIG. 4 may include some or all features of previously described semiconductor devices in accordance with the disclosure. In contrast to foregoing examples, the semiconductor device 400 may include at least one diepad 12 arranged opposite to the first row of leads 2A. In the illustrated case, the semiconductor device 400 may include an exemplary number of two diepads 12 which may be configured as chip carriers for the second semiconductor chip 6B and the third semiconductor chip 6C, respectively. Each of the diepads 12 may be connected to a lead protruding out of the encapsulation material 10. In addition, a row of third leads 2C may be arranged between the leads of the diepads. In the example of FIG. 4, the semiconductor chips 6B and 6C may be directly mounted on the diepads 12. In further examples, electrically insulating layers (not illustrated) may be arranged between the semiconductor chips 6B and 6C and the diepads 12. In yet further examples, each diepad 12 may be supported by two tie bars, or at least two leads, or one tie bar and at least one lead, such that the vibration effect on the semiconductor chips 6A and/or 6B during a bonding process and/or a molding process may be reduced due to the sufficient support of the diepads 12.

Figure 5:
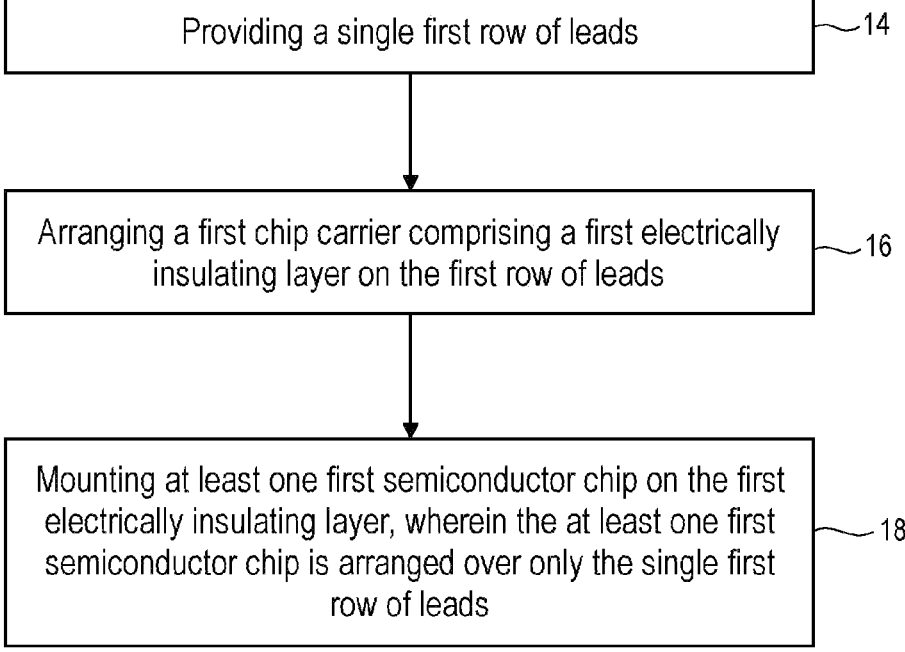
FIG. 5 illustrates a flowchart of a method for manufacturing a semiconductor device in accordance with the disclosure.

FIG. 5 illustrates a flowchart of a method for manufacturing a semiconductor device in accordance with the disclosure. The method of FIG. 5 is described in a general manner in order to qualitatively specify aspects of the present disclosure. The method may include further aspects. For example, the method may be extended by any of the aspects described in connection with other examples in accordance with the disclosure. For example, the method may be used for manufacturing any of the previously described semiconductor devices in accordance with the disclosure.

At 14, a single first row of leads may be provided. At 16, a first chip carrier comprising a first electrically insulating layer may be arranged on the single first row of leads. At 18, at least one first semiconductor chip may be mounted on the first electrically insulating layer, wherein the at least one first semiconductor chip is arranged over only the single first row of leads.

EXAMPLES

In the following, semiconductor devices and methods for manufacturing such semiconductor devices in accordance with the disclosure will be explained by means of examples.

Example 1 is a semiconductor device, comprising: a single first row of leads; a first chip carrier, comprising a first electrically insulating layer arranged on the single first row of leads; and at least one first semiconductor chip mounted on the first electrically insulating layer, wherein the at least one first semiconductor chip is arranged over only the single first row of leads.

Example 2 is a semiconductor device according to Example 1, wherein the first row of leads is formed by multiple leads arranged in parallel in a side-by-side manner.

Example 3 is a semiconductor device according to Example 1 or 2, wherein the at least one first semiconductor chip is fully arranged over the first row of leads.

Example 4 is a semiconductor device according to one of the preceding Examples, wherein the at least one first semiconductor chip is fully arranged over the first electrically insulating layer.

Example 5 is a semiconductor device according to one of the preceding Examples, wherein the at least one first semiconductor chip is electrically coupled to the first row of leads.

Example 6 is a semiconductor device according to one of the preceding Examples, wherein the first electrically insulating layer comprises at least one of an adhesive film, an adhesive tape, a Kapton® tape, or a die attach film.

Example 7 is a semiconductor device according to one of the preceding Examples, further comprising: a second row of leads, wherein the second row of leads is arranged opposite to the first row of leads; and at least one second semiconductor chip arranged over the second row of leads.

Example 8 is a semiconductor device according to Example 7, wherein the at least one second semiconductor chip is fully arranged over the second row of leads.

Example 9 is a semiconductor device according to Example 7 or 8, wherein: the first electrically insulating layer is arranged over the second row of leads, and the at least one second semiconductor chip is mounted on the first electrically insulating layer.

Example 10 is a semiconductor device according to Example 7 or 8, further comprising: a second chip carrier, comprising a second electrically insulating layer arranged on the second row of leads, wherein the at least one second semiconductor chip is mounted on the second electrically insulating layer.

Example 11 is a semiconductor device according to Example 10, wherein: the first electrically insulating layer is fully arranged over the first row of leads, and the second electrically insulating layer is fully arranged over the second row of leads.

Example 12 is a semiconductor device according to one of Examples 7 to 11, wherein: the first row of leads and the at least one first semiconductor chip are configured to operate in a low voltage domain, and the second row of leads and the at least one second semiconductor chip are configured to operate in a high voltage domain.

Example 13 is a semiconductor device according to one of Examples 7 to 12, wherein: at least one lead of the first row of leads is configured as an input of the semiconductor device, and at least one lead of the second row of leads is configured as an output of the semiconductor device.

Example 14 is a semiconductor device according to one of the preceding Examples, wherein the semiconductor device is free of diepads.

Example 15 is a semiconductor device according to one of Examples 1 to 6, further comprising: at least one diepad arranged opposite to the first row of leads; and at least one second semiconductor chip arranged on the at least one diepad.

Example 16 is a semiconductor device according to one of Examples 7 to 15, wherein the at least one first semiconductor chip and the at least one second semiconductor chip are configured to operate as a gate driver or a digital isolator.

Example 17 is a method for manufacturing a semiconductor device, the method comprising: providing a single first row of leads; arranging a first chip carrier comprising a first electrically insulating layer on the single first row of leads; and mounting at least one first semiconductor chip on the first electrically insulating layer, wherein the at least one first semiconductor chip is arranged over only the single first row of leads.

As employed in this specification, the terms "connected", "coupled", "electrically connected", and/or "electrically coupled" may not necessarily mean that elements must be directly connected or coupled together. Intervening elements may be provided between the "connected", "coupled", "electrically connected", or "electrically coupled" elements.

Further, the word "over" used with regard to e.g. a material layer formed or located "over" a surface of an object may be used herein to mean that the material layer may be located (e.g. formed, deposited, etc.) "directly on", e.g. in direct contact with, the implied surface. The word "over" used with regard to e.g. a material layer formed or located "over" a surface may also be used herein to mean that the material layer may be located (e.g. formed, deposited, etc.) "indirectly on" the implied surface with e.g. one or multiple additional layers being arranged between the implied surface and the material layer.

Furthermore, to the extent that the terms "having", "containing", "including", "with", or variants thereof are used in either the detailed description or the claims, such terms are intended to be inclusive in a manner similar to the term "comprising". That is, as used herein, the terms "having", "containing", "including", "with", "comprising", and the like are open-ended terms that indicate the presence of stated elements or features, but do not preclude additional elements or features. The articles "a", "an", and "the" are intended to include the plural as well as the singular, unless the context clearly indicates otherwise.

Moreover, the word "exemplary" is used herein to mean serving as an example, instance, or illustration. Any aspect or design described herein as "exemplary" is not necessarily to be construed as advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims may generally be construed to mean "one or multiple" unless specified otherwise or clear from context to be directed to a singular form. Also, at least one of A and B or the like generally means A or B or both A and B.

Devices and methods for manufacturing devices are described herein. Comments made in connection with a described device may also hold true for a corresponding method and vice versa. For example, if a specific component of a device is described, a corresponding method for manufacturing the device may include an act of providing the component in a suitable manner, even if such act is not explicitly described or illustrated in the figures.

Although the disclosure has been shown and described with respect to one or multiple implementations, equivalent alterations and modifications will occur to others skilled in the art based at least in part upon a reading and understanding of this specification and the annexed drawings. The disclosure includes all such modifications and alterations and is limited only by the concept of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the disclosure. In addition, while a particular feature of the disclosure may have been disclosed with respect to only one of several implementations, such feature may be combined with one or multiple other features of the other implementations as may be desired and advantageous for any given or particular application.

What is claimed is:

1. A semiconductor device, comprising:
a single first row of leads, wherein the single first row of leads is formed by multiple leads arranged in parallel in a side-by-side manner;
a first chip carrier, comprising a first electrically insulating layer arranged on a top side of the single first row of leads, wherein a bottom side of the single first row of leads is not covered by the electrically insulating layer;
at least one first semiconductor chip mounted on the first electrically insulating layer, wherein the at least one first semiconductor chip is arranged over only the single first row of leads;
a second row of leads, wherein the second row of leads is arranged opposite to the first row of leads; and at least one second semiconductor chip arranged over the second row of leads.

2. The semiconductor device of claim 1, wherein a footprint of the at least one first semiconductor chip is fully arranged over the first row of leads.

3. The semiconductor device of claim 1, wherein a footprint of the at least one first semiconductor chip is fully arranged over the first electrically insulating layer.

4. The semiconductor device of claim 1, wherein the at least one first semiconductor chip is electrically coupled to the first row of leads.

5. The semiconductor device of claim 1, wherein the first electrically insulating layer comprises an adhesive film, an adhesive tape, a Kapton® tape, or a die attach film.

6. The semiconductor device of claim 1, wherein a footprint of the at least one second semiconductor chip is fully arranged over the second row of leads.

7. The semiconductor device of claim 1, wherein:
the first electrically insulating layer is arranged over the second row of leads, and
the at least one second semiconductor chip is mounted on the first electrically insulating layer.

8. The semiconductor device of claim 1, further comprising:
a second chip carrier, comprising a second electrically insulating layer arranged on the second row of leads, wherein the at least one second semiconductor chip is mounted on the second electrically insulating layer.

9. The semiconductor device of claim 8, wherein:
a footprint of the first electrically insulating layer is fully arranged over the first row of leads, and
a footprint of the second electrically insulating layer is fully arranged over the second row of leads.

10. The semiconductor device of claim 1, wherein:
the first row of leads and the at least one first semiconductor chip are configured to operate in a low voltage domain, and
the second row of leads and the at least one second semiconductor chip are configured to operate in a high voltage domain.

11. The semiconductor device of claim 1, wherein:
at least one lead of the first row of leads is configured as an input of the semiconductor device, and
at least one lead of the second row of leads is configured as an output of the semiconductor device.

12. The semiconductor device of claim 1, wherein the semiconductor device is free of diepads.

13. The semiconductor device of claim 1, wherein the at least one first semiconductor chip and the at least one second semiconductor chip are configured to operate as a gate driver or a digital isolator.

14. A method for manufacturing a semiconductor device, the method comprising:
providing a single first row of leads, wherein the first row of leads is formed by multiple leads arranged in parallel in a side-by-side manner;
arranging a first chip carrier comprising a first electrically insulating layer on a top side of the single first row of leads, wherein a bottom side of the single first row of leads is not covered by the electrically insulating layer;
mounting at least one first semiconductor chip on the first electrically insulating layer, wherein the at least one first semiconductor chip is arranged over only the single first row of leads;
arranging a second row of leads opposite to the first row of leads; and arranging at least one second semiconductor chip over the second row of leads.

* * * * *